United States Patent
Iacoponi et al.

(10) Patent No.: US 6,261,946 B1
(45) Date of Patent: *Jul. 17, 2001

(54) METHOD FOR FORMING SEMICONDUCTOR SEED LAYERS BY HIGH BIAS DEPOSITION

(75) Inventors: John A. Iacoponi, San Jose; Dirk Brown, Santa Clara; Takeshi Nogami, Sunnyvale, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,068
(22) Filed: Jan. 5, 1999
(51) Int. Cl.[7] ........................................ H01L 21/31
(52) U.S. Cl. ............................. 438/637; 257/774
(58) Field of Search .................... 438/637, 355; 257/767, 774

(56) References Cited

U.S. PATENT DOCUMENTS

| | | | |
|---|---|---|---|
| 4,792,842 | * | 12/1988 | Honma et al. . |
| 5,789,308 | * | 8/1998 | DeBusk et al. . |
| 5,814,238 | * | 9/1998 | Ashby et al. . |
| 5,861,344 | * | 1/1999 | Roberts et al. . |
| 5,929,526 | * | 7/1999 | Srinivasan . |
| 5,933,753 | * | 8/1999 | Simon et al. . |
| 5,946,593 | * | 8/1999 | Saitoh . |

* cited by examiner

Primary Examiner—George Fourson
Assistant Examiner—Joannie Adelle Garcia
(74) Attorney, Agent, or Firm—Mikio Ishimaru

(57) ABSTRACT

A method is provided for forming seed layers in a channel or via by applying a high bias to the material of the seed layer during deposition. This sputters off the seed layer overhang in order to reduce the electrical resistance of the seed layer, maintain its barrier effectiveness and enhance the subsequent filling of the channel or via by conductive materials.

19 Claims, 2 Drawing Sheets

METHOD FOR FORMING SEMICONDUCTOR SEED LAYERS BY HIGH BIAS DEPOSITION

CROSS-REFERENCE TO RELATED APPLICATION

The present application contains subject matter related to a concurrently filed U.S. patent application by John A. Iacoponi, Dirk Brown, and Takeshi Nogami entitled "METHOD FOR FORMING SEMICONDUCTOR SEED LAYERS BY INERT GAS SPUTTER ETCHING". This and the related application, identified by docket number D422, are commonly assigned to Advanced Micro Devices, Inc.

TECHNICAL FIELD

The present invention relates generally to semiconductors and more specifically to seed materials used in semiconductor processing.

BACKGROUND ART

While manufacturing integrated circuits, after the individual devices, such as the transistors, have been fabricated in the silicon substrate, they must be connected together to perform the desired circuit functions. This connection process is generally called "metallization", and is performed using a number of different photolithographic and deposition techniques.

One metallization process, which is called the "damascene" technique starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metallization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride layer. This is followed by deposition of a thin via nitride layer. Then a via step photoresist is used in a photolithographic process to designate round via areas over the first channels.

A nitride etch is then used to etch out the round via areas in the via nitride layer. The via step photoresist is then removed, or stripped. A second channel dielectric layer, which is typically an oxide layer, is then deposited over the via nitride layer and the exposed oxide in the via area of the via nitride layer. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metallization process. The elimination of metal etch steps is important as the semiconductor industry moves from aluminum to other metallization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), or tungsten nitride (WN) are used as barrier materials for copper.

Thus, a thin adhesion layer formed of an adhesion material, such as titanium, is first deposited on the dielectric in the channels and vias to ensure good adhesion and good electrical contact of the subsequently deposited barrier layers to underlying doped regions and/or conductive channels. Adhesion/barrier layer stacks formed of adhesion/barrier materials such as tantalum/tantalum nitride (Ta/TaN), titanium/titanium nitride (Ti/TiN), and tungsten/tungsten nitride (W/WN) have been found to be useful as adhesion/barrier material combination for copper interconnects.

After deposition of the adhesion/barrier material, a seed layer is deposited by ionized metal plasma (IMP) deposition. Generally, the metal deposited is copper or a copper alloy. The copper seed layer provides the base for the subsequent copper electroplating which will fill the channels and vias.

The common problems associated with most of the seed layer deposition techniques are poor sidewall step coverage and conformality, i.e., the seed layer thickness is much higher in wide-open areas, such as on top of the channel oxide layer, in the upper portion of the sidewalls of the channels and vias, and bottom of the channels than in the lower portion of the sidewalls of the channels and vias. To guarantee the current minimum seed layer thickness of 10 nm anywhere in the channel or vias, including at the lower portion of the sidewalls, the seed layer thickness in wide-open areas tends to be much higher than 10 nm. As the width of the channels and vias have decreased in size due to the size reduction in the semiconductor devices, an excessively thick seed layer in the wide-open areas interferes with the subsequent filling of the channel and vias with conductive materials.

A solution, which would form uniform seed layers in channel or vias and result in an improvement in the subsequent filling of the channel or vias by conductive materials, has long been sought, but has eluded those skilled in the art. As the semiconductor industry is moving from aluminum to copper and other types of materials, it is becoming more pressing that a solution be found.

DISCLOSURE OF THE INVENTION

The present invention provides a method for forming seed layers in channel or vias by using a high bias deposition step during the ionized metal plasma deposition of the seed layers. This results in seed layers with reduced overhang in the channel and via areas enhancing the subsequent filling of the channel or vias by conductive materials.

The present invention still further provides a method for forming seed layers in channel or vias with improved step coverage and conformality.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
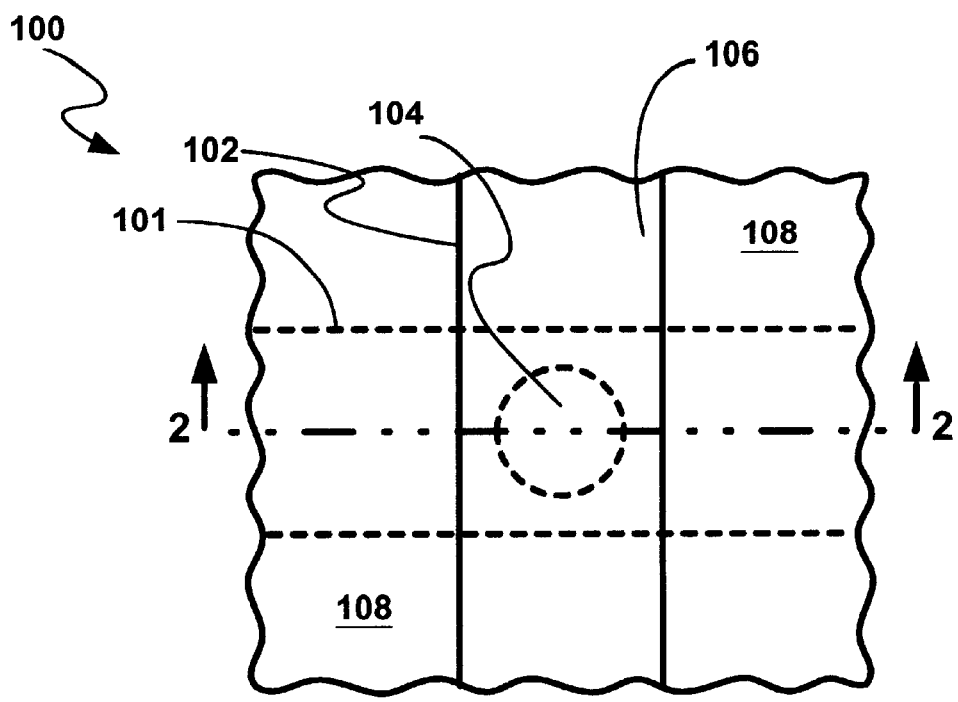
FIG. 1A (PRIOR ART) is a plan view of aligned channels with a prior art via.

Referring now to FIG. 2A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
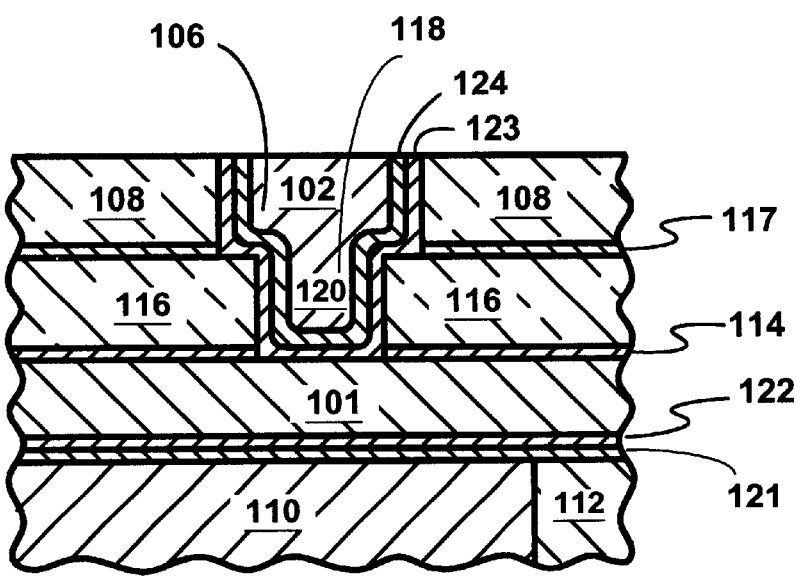
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are an adhesion/barrier layer 121 and seed layer 122, and around the second channel 102 and the cylindrical via 120 is an adhesion/barrier layer 123 and seed layer 124.

Figure 1C:
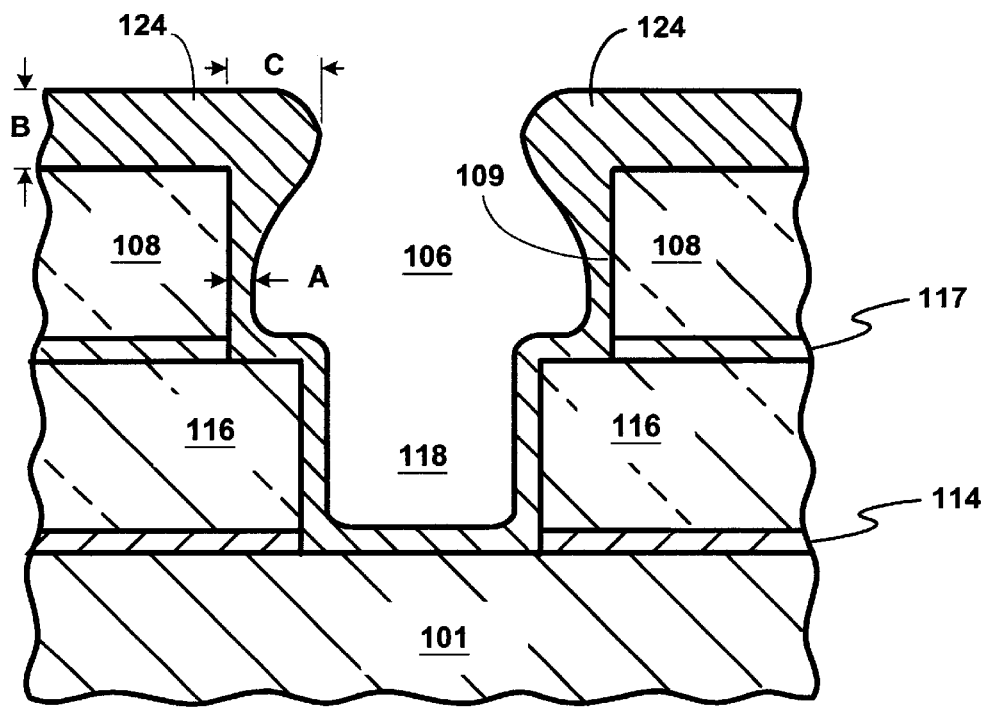
FIG. 1C (PRIOR ART) is a simplifed-cross-section of FIG. 1A (PRIOR ART) along line 2—2 immediately after the deposition of seed material in the second channel opening.

Referring now to FIG. 1C (PRIOR ART), therein is shown the cross section of the semiconductor wafer 100 along 2—2 immediately after the deposition of the seed layer 124 and prior to the filling of the second channel opening 106 and via 118 with the second conductive material. For purpose of clarity, the adhesion/barrier layer 123, seed layer 122, adhesion/barrier layer 121, polysilicon gate 110 and dielectric 112 are not shown. As explained in the Background Art, the common problems associated with most of PVD and IMP techniques are poor sidewall step coverage and conformality, i.e., the seed layer thickness is much higher in wide-open areas, such as on top of the second channel oxide layer 108 and in the upper portion of the sidewalls 109 of the second channel opening 106. The sidewall step coverage and conformality are defined as follows:

Sidewall step coverage=$A/B$

Conformality=$A/C$ where A is the thickness of the thinnest area of the seed layer 124 along the sidewalls 109, B is the thickness of the seed layer 124 on top of the second channel oxide layer 108, and C is the thickness, or overhang, of the thickest area of the seed layer 124 along the sidewalls 109. It is desirable to have high values in sidewall step coverage and conformality. In this case, since A is much smaller than either B or C, the sidewall step coverage and conformality would be low, indicating poor sidewall step coverage and conformality.

To guarantee a minimum seed layer thickness of 10 nm anywhere in the channel opening 106, including at the lower portion of the sidewalls 109, the seed layer thickness in the wide-open areas tends to be much higher than 10 nm. As the width of the channels and vias have decreased in size due to the size reduction in the semiconductor devices, anything which closes the channel opening affects the fill. An excessively thick seed layer in the upper portion of the sidewalls of the second channel opening 102 would interfere with the subsequent filling of the second channel opening 106 and via 118 with the second conductive material.

Figure 2:
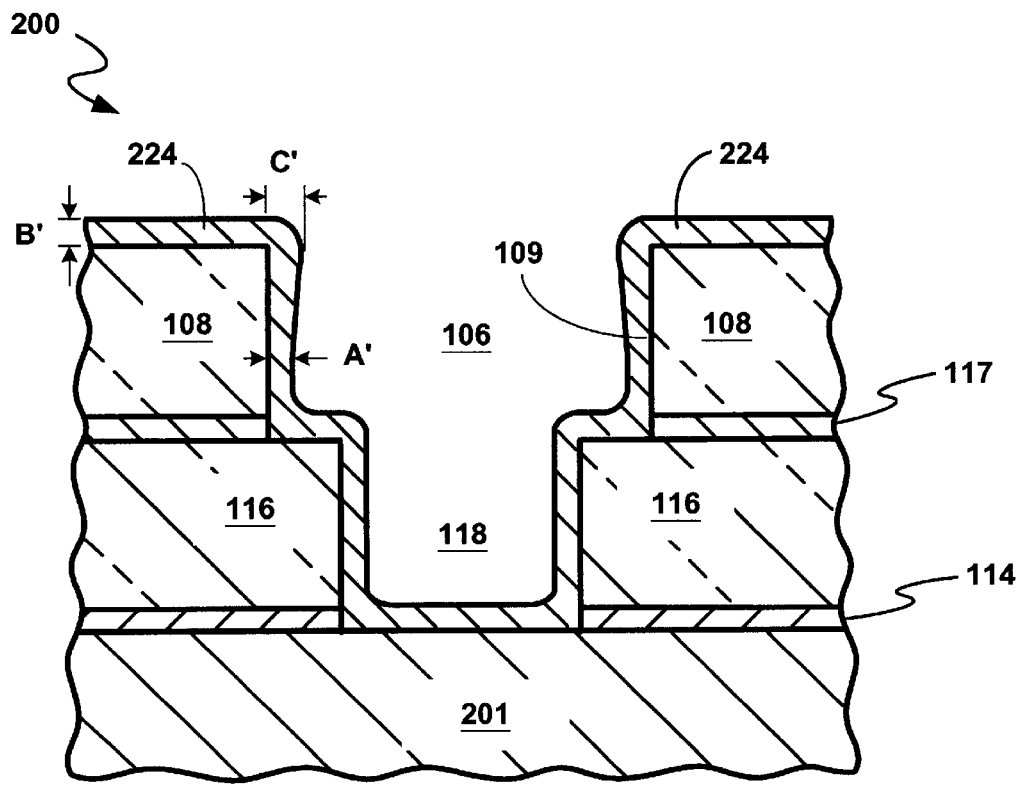
FIGS. 2 is a simplified cross-section of a semiconductor wafer formed in accordance with the present invention

Referring to FIG. 2, therein is shown the cross-section of a semiconductor wafer 200 with a pair of perpendicularly aligned semiconductor channels connected by a via 118. For convenience of illustration, like reference numerals are used in FIG. 2 to denote like elements already described in FIG. 1A (PRIOR ART) through FIG. 1C (PRIOR ART). Similarly, for purposes of clarity, the adhesion/barrier layer 123, seed layer 122, adhesion/barrier layer 121, polysilicon gate 110 and dielectric 112 are not shown.

At this stage a seed layer 224 is shown formed in the second channel opening 106 after a partial etch back using plasma etching but prior to the filling of second channel opening 106 and via 118 with the second conductive material. The plasma etching is an isotropic etching, which removes more seed material from the wide-open areas, such as on top of the second channel oxide layer 108 and in the upper portion of the sidewalls 109 of the second channel opening 106, and results in a thinner seed layer around the wide-open areas and more even coverage on the sidewalls 109. Specifically, the thickness of the seed layer 224 on top of the second channel oxide layer 108 (B') and the thickness of the thickest area of the seed layer 224 along sidewalls 109 (C') have reduced significantly due the etch back, while the thickness of the thinnest area of the seed layer 224 along the sidewalls 109 (A') has not changed much. Accordingly, both the sidewall step coverage (A'/B') and conformality (A'/C') have increased.

In production, a conventional first damascene process was used to put down over a production semiconductor wafer 200 a first channel 201 in a first channel oxide layer (not shown) above portions of a semiconductor device (not shown). The damascene process is a photolithographic process which uses a mask to define a first channel opening (not shown) in the first channel oxide layer. The first channel opening is then filled with a first conductive material, such as copper, to form the first channel 201 using conventional metal deposition technique, such as physical vapor deposition, chemical vapor deposition, electroplating, or a combination thereof. The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via 104 in the via nitride layer 117, the basis for the cylindrical via 118 was formed. The subsequent deposition of the second channel oxide layer 108 prepared the way for the second channel 106 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via 118 down to the stop nitride layer 114. The anisotropic oxide etch etches faster in the vertical direction of FIG. 2 than in the horizontal direction. The nitride etch of the stop nitride layer 114 exposes a portion of the first channel 201 and completes the etching steps.

Next, a thin adhesion/barrier layer (not shown) is deposited in the second channel opening 106 and the cylindrical via 118, including along the walls of the second channel opening 106 and the cylindrical via 118. The thickness of the adhesion/barrier material is insufficient to fill the second channel opening 106 and the cylindrical via 118. Examples of suitable adhesion materials include refractory metals such as titanium, tantalum, and tungsten and of barrier materials include titanium nitride, tantalum nitride, and tungsten nitride. The adhesion/barrier layer is deposited using conventional deposition techniques, such as physical vapor deposition, chemical vapor deposition, or a combination thereof.

Thereafter, a thin seed layer 224 is deposited on the adhesion layer in the second channel opening 106 and the cylindrical via 118. Again, the thickness of the seed layer 224 is insufficient to fill the second channel opening 106 and the cylindrical via 118. Examples of suitable seed materials include aluminum, copper, gold, silver, alloys thereof, and combinations thereof. The seed layer 224 is deposited using conventional ionized metal plasma deposition process.

During the latter portion of the deposition of the seed layer 224, a high bias is applied to the wafer in accordance with the present invention. While the normal bias is 10 volts, the high bias would be in the range of 60 to 100 volts and would be applied between 20% and 80% of the total deposition time. The high bias causes the metal ions to be accelerated towards the wafer to preferentially sputter away excessive seed layer material in the wide-open areas around the second channel opening 106. This high bias sputtering will not remove much of seed layer 224 around the lower portion of the sidewalls 109.

The bias parameters can be heuristically determined to optimize the removal process so that the excessive seed layer thickness in the wide-open areas around the second channel opening 106 are removed while the thickness of the resultant seed layer anywhere in the second channel opening 106 still meets the minimum seed layer thickness requirement. The high bias cannot be used for the entire deposition process because it would expose the underlying dielectric in such a situation.

Next, the second conductive material is deposited into second channel opening 106 and via 118 using conventional metal deposition technique, such as physical vapor deposition, chemical vapor deposition, electroplating, or a combination thereof. Thereafter, a chemical mechanical polishing process is used to complete the conventional connection process similar to what were shown and described in FIG. 1A and 1B.

Accordingly, by using a high bias deposition step during conductive material deposition to sputter back the seed layer, the present invention forms seed layers in channel openings or vias with reduced electrical resistance while maintaining the barrier effectiveness of the seed layer and enhancing the proper filling of the channel openings or vias by conductive materials.

While the best mode utilizes copper as the conductive material, it should be understood that the present invention is applicable to other conductive materials such as aluminum, tungsten, doped polysilicon, copper-base alloys, gold, gold-base alloys, silver, and silver-base alloys.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a seed layer in a channel opening and a via atop another conductive channel (201 as shown in FIG. 2), it should be understood that the present invention is applicable to forming a seed layer in a channel opening and/or a via atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming a seed layer over said dielectric layer and in said opening, including along said walls, said seed layer formed to a thickness insufficient to fill said opening;

biasing material of said seed layer to sputter said seed layer to reduce its thickness at least on top of said dielectric layer and around an upper portion of said walls whereby biasing said material of said seed layer increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said sidewalls; and forming a layer of conductive material in contact with said seed layer, said conductive material layer substantially fills said opening.

2. The method as claimed in claim 1 wherein biasing said material of said seed layer is done at a substantially higher bias than that used for forming said seed layer.

3. The method as claimed in claim 1 including:

forming an adhesion/barrier layer on said dielectric layer and in said opening, including along said walls, in contact with said region of said semiconductor substrate to bond said seed layer thereto; and forming of said adhesion/barrier layer is done by a process selected from a group consisting of physical vapor deposition, chemical vapor deposition, and a combination thereof.

4. The method as claimed in claim 1 further including:

forming an adhesion/barrier layer on said dielectric layer and in said opening, including along said walls, in contact with said region of said semiconductor substrate to bond said seed layer thereto; and forming of said adhesion/barrier layer is done with a material selected from a group consisting of titanium, tantalum, tungsten, titanium nitride, tantalum nitride, tungsten nitride, and a combination thereof.

5. The method as claimed in claim 1 wherein forming said seed layer is done by a process of ionized metal plasma deposition.

6. The method as claimed in claim 1 wherein forming said seed layer is done with a material selected from a group consisting of aluminum, copper, gold, silver, an alloy thereof, and a combination thereof.

7. The method as claimed in claim 1 wherein biasing said material of said layer of conductive material is done at a high bias of 40 volts to 100 volts.

8. The method as claimed in claim 1 wherein biasing said material of said layer of conductive material is done at a high bias of 60 volts to 100 volts and for 20% to 80% of the time said biasing step is performed.

9. The method as claimed in claim 1 wherein forming said layer of conductive material is done with a material selected from a group consisting of aluminum, doped polysilicon, copper, gold, silver, an alloy thereof, and a combination thereof.

10. The method as claimed in claim 1 wherein said region exposed is a doped region formed on said semiconductor substrate.

11. A method of manufacturing a semiconductor device, comprising:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion layer on said dielectric layer and in said opening, including along said walls, in contact with said region of said semiconductor substrate, said adhesion layer formed to a thickness insufficient to fill said opening, wherein forming said adhesion layer is done by physical vapor deposition, chemical vapor deposition, or a combination thereof;

forming a seed layer in contact with said adhesion layer, said seed layer formed to a thickness insufficient to fill said opening, wherein forming said seed layer is done by physical vapor deposition chemical vapor deposition, or a combination thereof;

increasing the bias to material of said seed layer during deposition thereof to reduce its thickness ay least on top of said dielectric layer and around an upper portion of said walls, wherein increasing the bias increases sidewall step coverage and conformality of said seed layer, sidewall step coverage is defined to be A/B and conformality is defined to be A/C, where A is the thickness of the thinnest area of said seed layer along side walls, B is the thickest of the said seed layer on said dielectric layer, and C is the thickness of the thickest area of said seed layer along said walls; and forming a layer of conductive material in contact with said seed layer, said conductive material layer substantially fills said opening, wherein forming said layer of conductive material is done by a process selected from a group consisting of physical vapor deposition, chemical vapor deposition, electroplating, and a combination thereof.

12. The method as claimed in claim 11 wherein forming said adhesion layer is done with a material selected from a group consisting of titanium, tantalum, and tungsten.

13. The method as claimed in claim 11 wherein forming said seed layer is done with a material selected from a group consisting of aluminum, copper, gold, silver, an alloy thereof, and a combination thereof.

14. The method as claimed in claim 11 wherein forming said layer of conductive material is done with a material selected from a group consisting of aluminum, tungsten, doped polysilicon, copper, gold, and silver.

15. The method as claimed in claim 11 wherein biasing said material of said layer of conductive material is done at a high bias of 60 volts to 100 volts and for 20% to 80% of the time said biasing step is performed.

16. The method as claimed in claim 11, wherein said region exposed is a conductive channel formed on said semiconductor substrate.

17. A method of manufacturing a semiconductor device, comprising:

providing a semiconductor substrate with a dielectric layer formed thereon, wherein said dielectric layer overlays a region on said semiconductor substrate;

forming an opening in said dielectric layer, said opening defined by walls of said dielectric layer and exposes a portion of said region on said semiconductor substrate;

forming an adhesion layer of a material selected from the group consisting of titanium, tantalum, tungsten on said dielectric layer and in said opening, including along said walls, in contact with said region of said semiconductor substrate, said adhesion layer formed to a thickness insufficient to fill said opening, wherein forming said adhesion layer is done by a process selected from a group consisting of physical vapor deposition, chemical vapor deposition, and a combination thereof;

forming a seed layer of a material selected from the group consisting of aluminum, gold, silver, an alloy thereof, and a combination thereof in contact with said adhesion layer, said seed layer formed to a thickness insufficient to fill said opening, wherein forming said seed layer is done by physical vapor deposition, chemical vapor deposition, or a combination thereof;

applying a high bias to material of said seed layer during deposition to reduce its thickness at least on top of said dielectric layer and around an upper portion of said walls, wherein applying a high bias increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said walls; and forming a layer of conductive material in contact with said seed layer, wherein said conductive material is selected from a group consisting of aluminum, tungsten, doped polysilicon, copper, gold and silver, said conductive material layer substantially fills said opening, and forming said layer of conductive material is done by a process selected from a group consisting of physical vapor deposition, chemical vapor deposition, electroplating, and a combination thereof.

18. The method as claimed in claim 17, wherein said region exposed is a conductive channel formed on said semiconductor substrate.

19. The method as claimed in claim 17, wherein said region exposed is a doped region formed on said semiconductor substrate.

* * * * *